United States Patent [19]

Pappanikolaou

[11] 4,168,761

[45] Sep. 25, 1979

[54] SYMMETRICAL AIR FRICTION ENCLOSURE FOR SPEAKERS

[76] Inventor: George Pappanikolaou, 621 90th St., Brooklyn, N.Y. 11228

[21] Appl. No.: 720,419

[22] Filed: Sep. 3, 1976

[51] Int. Cl.[2] .............................. H05K 5/00

[52] U.S. Cl. .............................. 181/156; 181/152; 181/194; 181/199

[58] Field of Search .............. 181/148, 150, 151, 152, 181/153, 156, 199, 194; 179/1 E

[56] References Cited

U.S. PATENT DOCUMENTS

| | | | |
|---|---|---|---|
| 2,277,525 | 3/1942 | Mercurius | 181/156 |
| 3,327,808 | 6/1967 | Shaper | 181/153 |
| 3,523,589 | 8/1970 | Virva | 181/151 |
| 3,529,691 | 9/1970 | Wesemann | 181/156 |
| 3,993,162 | 11/1976 | Juuti | 181/156 |

FOREIGN PATENT DOCUMENTS

| | | | |
|---|---|---|---|
| 26943 | 11/1954 | Finland | 181/156 |
| 1241240 | 8/1960 | France | 181/156 |
| 337264 | 10/1930 | United Kingdom | 181/156 |

*Primary Examiner*—Stephen J. Tomsky

[57] ABSTRACT

The disclosure concerns itself with labyrinth speakers systems which are provided with a plurality of internal partitions which are generally spaced from each other and are provided with apertures therein to form at least one tortuous path for a backwave generated by a loudspeaker. In one embodiment, the partitions are substantially cylindrical walls concentrically aligned with each other. The cylindrical walls have different diameters to form annular intermediate chambers. Other embodiments described include partitions which are planar and are substantially rectangular in shape. These partitions are spaced from each other along an axis of symmetry and are alternately provided with peripheral and central openings so that the backwave, while propagating between an initial and a final chamber of the enclosure, are successively broken up into a substantially annular shape and subsequently reconstituted. The intermediate chambers, including the apertures formed therein, substantially increase the overall surface area and form a tortuous path having an increased number of bends to thereby increase the effective length to the backwave.

7 Claims, 18 Drawing Figures

SYMMETRICAL AIR FRICTION ENCLOSURE FOR SPEAKERS

BACKGROUND OF THE INVENTION

The present invention generally relates to speaker enclosures, and more specifically to a symmetrical air friction enclosure for speakers which comprises an improved labyrinth type enclosure which provides good performance in a small external volume.

Labyrinth-type speakers are well known. The first speaker enclosure that did not increase the speaker free air resonance was patented in 1936 by Benjamin Olney (U.S. Pat. No. 2,031,500). The typical acoustic labyrinth is essentially a long folded tube, acoustically lined with acoustical material, mounted behind the speaker. The acoustical material is used in the labyrinth to increase the effective length of the tube as seen by the backwave. However, such stuffing or lining has a tendency to over-damp the low frequencies being produced.

The effective length of the labyrinth tube is generally selected to be approximately equal to one-half the wavelength of the free air resonance frequency of the loudspeaker. At this length, the backwave is essentially shifted 180° out of phase and reinforces the frontwave. At one-quarter the wavelength, the anti-resonant action of the pipe offers maximum damping to the speaker. On the other hand, as mentioned above, at the half wavelength frequency, the emerging wave is in phase with that coming from the front of the cone, adding to the speaker's output. A discussion of labyrinth speakers is presented in "Popular Electronics", January, 1972, at page 40.

Since the length of the tube of a labyrinth speaker is generally related to the wavelength at the free air resonance frequence of the loudspeaker, and such free air resonance frequencies can be as low as 30 Hz., the effective lengths of labyrinth tubes can be greater than 7 feet long. Accordingly, labyrinth speakers are generally large in size, bulky and have large volumes.

The fold in the tube of the labyrinth is generally accomplished by use of one or two partitions within the enclosure. However, this leaves substantial portions of the cabinet or enclosure unbraced and therefore susceptible to undesired vibrations and induced resonances.

Other types of non-labyrinth speakers are known which utilize various partitions therein to either increase the effective length of a path, to produce a horn having an increasingly large cross-sectional area, or to serve as baffles. For example, U.S. Pat. No. 3,327,808 discloses a loudspeaker housing having as its object to obtain an improved bass response. However, the loudspeaker housing disclosed in this patent is for a resonant column-type enclosure, which consists of a speaker at one end and a series of constrictions at the other end of a tube. The constrictions appear in the housing outer wall and the constructions or apertures have dimensions selected to make the same frequency selective by producing inductive effects and acting to cut off higher frequencies. The resonant column may be folded or telescoped but it is shorter in length than a labyrinth. More importantly, the resonant column increases the free air resonance frequency of the speaker housed in it, and has an irregular polar sound distribution curve. This is its main disadvantage. For a discussion of resonant column-type enclosures, see "How to Build Speaker Enclosures", by Alex Badmaieff and Don Davis, Howard W. Sams and Co., 1973, page 115. In introducing the invention, the patentee of this patent distinguishes his invention by stating that his structure should not be confused with an acoustic labyrinth.

In U.S. Pat. No. 2,646,852, for a loud-speaker cabinet, the patentee discloses an enclosure provided with a plurality of internally spaced partitions. The partitions and apertures or openings between adjacent chambers or compartments is selected to provide one tortuous path which leads to a closed end, the reflected sound being retransmitted through its initial path and ultimately out through an output port located proximate to the loudspeaker. This construction is not a labyrinth type of construction and tends to increase the free air resonance frequency of the speaker.

Numerous constructions are also known which utilize internal partitions to generate or form a tortuous path for the front or backwave produced by a loudspeaker. For example, the following U.S. patents disclose various constructions of generally horn-type enclosures: U.S. Pat. Nos. 2,224,919; 2,310,243; 2,971,598; and 3,642,091. In each case, the partitions are generally arranged to produce a tortuous path which has an increasingly large cross-sectional area to either the front or to the backwave. Accordingly, the devices disclosed in these patents are not true labyrinth speakers and do not have the desirable characteristics thereof.

A twin equilateral sound speaker enclosure is disclosed in U.S. Pat. No. 3,529,691. The primary object of this device is to provide 360° dispersion of the sound over a wide frequency range. This is achieved by utilizing an enclosure provided with three substantially concentric tubes together forming a continuous path. However, the loudspeaker is mounted in the central portion of the enclosure in such a manner that it is the front wave which is caused to propagate through the tortuous path formed by the tubes while the back of the speaker is completely enclosed.

In U.S. Pat. No. 1,810,708, a method and apparatus for amplifying sound waves is disclosed. While the device disclosed utilizes a plurality of generally concentric cylindrical walls, this device is not an enclosure for a speaker. Additionally, since the cylindrical partitions each form a substantially annular space or chamber, reflections of the wave at the axial ends of the chambers from one chamber to the next in effect produces a horn-type enclosure where the cross-sectional area for the wave front increases step-wise instead of gradually and continuously as with conventional horns.

SUMMARY OF THE INVENTION

Accordingly, it is an object of the present invention to provide a labyrinth speaker system which does not exhibit the disadvantages inherent in the prior art speakers.

It is another object of the present invention to provide a labyrinth speaker system which is simple in construction and economical to manufacture.

It is still another object of the present invention to provide a labyrinth speaker system which exhibits a large internal surface area for the backwave as compared with its external volume.

It is yet another object of the present invention to provide a labyrinth speaker system which increases the number and amount of the bends in the speaker backwave path.

It is a further object of the present invention to provide a labyrinth speaker system which provides increased cabinet rigidity to thereby prevent sound colorations caused by cabinet resonances.

It is still a further object of the present invention to provide a labyrinth speaker system which may be made from wood, or materials other than wood such as stiff paper or cardboard cylinders or planar partitions.

It is yet a further object of the present invention to provide a labyrinth speaker system which can be constructed, in accordance with one embodiment, to have a substantially cylindrical shape of circular cross-section to minimize the frictional resistance to the backwave as it emerges from the enclosure.

It is an additional object of the present invention to provide a labyrinth speaker system which is highly versatile as it can easily be tailored to any loudspeaker by adding or subtracting partitions which comprise the tortuous path for the backwave.

It is still an additional object of the present invention to provide a labyrinth speaker system which may include a continuous path, having a substantially uniform cross-sectional area equal to approximately the effective cone area, extending at least a portion of the length travelled by the backwave.

In order to achieve the above objects, and other which will become evident hereafter, a labyrinth speaker system in accordance with the present invention is disclosed which substantially maintains the free air resonance frequency of a speaker mounted therein and has a generally large total internal surface area as compared to its volume. The speaker system includes a cabinet enclosure having a front, side and rear panels. Partition means is provided inside said enclosure for forming an initial chamber, a plurality of intermediate chambers, and a final chamber. Said initial chamber bounds on said front panel and said final chamber bounds on at least one of said panels. The enclosure has an output port opening to the outside thereof. Speaker means having an effective cone area is disposed within the enclosure for generating a backwave to be initially propagated into said initial chamber and a frontwave. Said partition means includes a plurality of generally parallel partitions which define adjacent intermediate chambers. Said partitions are spaced from each other along a predetermined direction and generally define an axis of symmetry. Said partitions are provided with aperture means communicating the interiors of respective adjacent intermediate chambers, said partitions and aperture means being arranged with respect to said axis of symmetry to form at least one tortuous path which causes said backwave to change directions of propagation at least 90° upon entry into each successive intermediate chamber. Said at least one tortuous path and said aperture means and said output port opening have effective areas for said backwave approximately equal to said effective cone area. At least one of said partitions and aperture means are spaced away from said axis of symmetry. In this manner, said backwave assumes a cross-sectional configuration which is generally annular in shape during propagation through at least portions of said intermediate chambers.

According to one presently preferred embodiment, said partitions are substantially cylindrical walls concentrically aligned with each other, said cylindrical walls having different diameters to form annular intermediate chambers. Said cylindrical walls are advantageously coaxially aligned with said axis of symmetry. According to other presently preferred embodiments, said partitions are planar and substantially rectangular in shape. Said partitions in accordance with said other embodiments are spaced from each other along said axis of symmetry. Alternate ones of said partitions are provided with aperture means in the nature of peripheral openings. Intermediate ones of said partitions disposed between said alternate partitions are provided with aperture means in the nature of central openings. In this manner, said backwave propagates in directions substantially normal to said axis of symmetry subsequent to passage through each aperture means in any one of said partitions. In the last mentioned embodiment, said partitions and aperture means are arranged to successively break up said backwave into said substantially annular shape and substantially reconstitute said backwave upon passage through said alternate and intermediate chambers respectively.

BRIEF DESCRIPTION OF THE DRAWINGS

Further advantages of the invention will become apparent from a reading of the following specification describing illustrative embodiments of the invention. This specification is to be taken with the accompanying drawings, in which.

DESCRIPTION OF THE PREFERRED EMBODIMENTS

Figure 1:
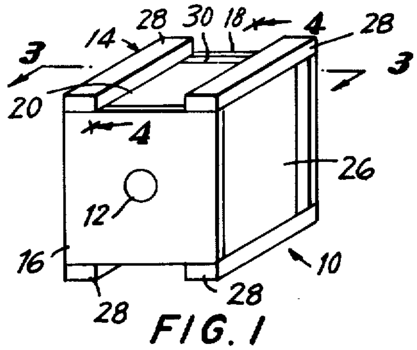
FIG. 1 is a perspective view of a labyrinth speaker system in accordance with the present invention, this embodiment comprising a substantially rectangular enclosure.

Referring now specifically to the Figures, in which identical or similar parts are designated by the same reference numerals throughout, and first referring to FIGS. 1–4, one presently preferred embodiment of a labyrinth speaker system in accordance with the present invention is generally designated by the reference numeral 10. The speaker system 10 houses a conventional loudspeaker 12 in a generally rectangular-type enclosure 14. The enclosure 14 includes a front panel 16, a rear panel 18, a top panel 20, a bottom panel 22, and side panels 26.

Figure 4:
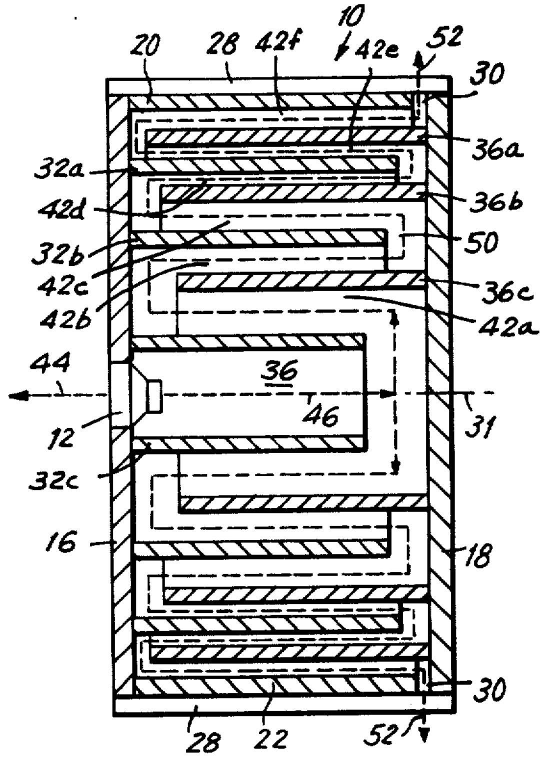
FIG. 4 is an enlarged cross-sectional area of the embodiment shown in FIG. 1, taken along line 4—4, and showing the arrangement of the internal cylindrical partitions which define the tortuous path for the backwave.

Bracing means in the nature of elongate bracing members 28 are provided which extend between and are rigidly connected to the front panel 16 and the rear panel 18. The bracing members 28 serve to rigidify the enclosure as well as maintain the front and rear panels 16 and 18 respectively spaced from each other at preselected distances, as will be more fully described below. As best shown in FIGS. 1 and 4, the top, bottom and side panels 20, 22 and 26 respectively, are mounted on the front panel 16 and have depths smaller than the distance between the front and rear panels 16 and 18. This results in an output port 30 in the nature of a peripheral vent extending proximate to the periphery of the rear panel 18. The output port or vent opening 30 serves as the exit port for the backwave as shown in FIG. 4.

As will become evident from the description that follows, the partitions of all of the embodiments in accordance with the present invention include partition means inside the enclosure for forming an initial chamber, a plurality of intermediate chambers, and a final chamber. The initial chamber bounds on the front panel 16 and the final chamber bounds on at least one of the other panels and has an output port opening, such as the vent opening 30, to the outside of the enclosure. In all of the embodiments to be described, the partition means includes a plurality of generally parallel partitions spaced from each other along a predetermined direction and generally defining an axis of symmetry such as the axis 31 shown in FIG. 4. The partitions, whether cylindrical or planar, are provided with aperture means which communicate the interiors of respective adjacent intermediate chambers. The partitions and aperture means are arranged with respect to the axis of symmetry to form at least one tortuous path which causes the backwave to change directions of propagation at least 90° upon entry into each successive intermediate chamber. The tortuous path, the aperture means and the output port opening have effective areas for the backwave approximately equal to the effective cone area of the speaker 12.

An important feature of the present invention, which increases the internal surface area for the backwave, is the arrangement of the partitions and apertures thereon with relation to the axis of symmetry to cause the backwave to assume a cross-sectional configuration which is generally annular in shape during propagation through at least one or more of the intermediate chambers. Hereinafter, for purposes of this specification and claims, the word annular and its derivatives will mean a cylindrical or tube-shaped configuration having substantially uniform cross-sectional area along its axis and having, for example, a circular or square shape.

Figure 2:
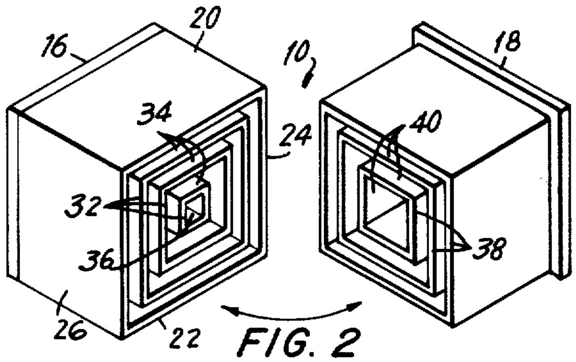
FIG. 2 is a perspective view of the two component sections of the enclosure system shown in FIG. 1, the two sections being separated to show the internal construction thereof.
Figure 3:
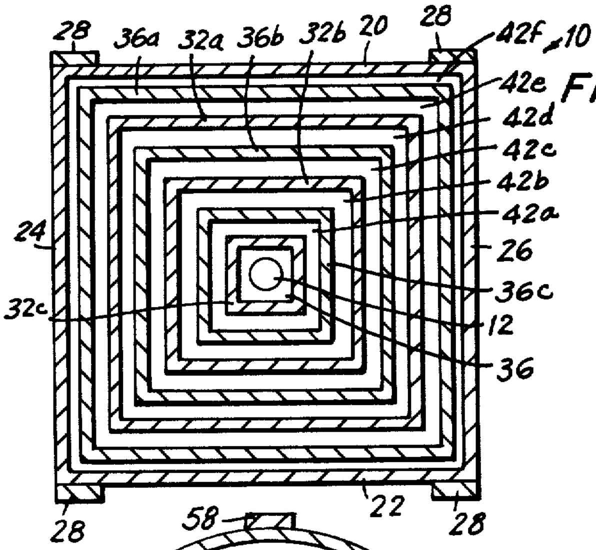
FIG. 3 is an enlarged cross-sectional area of the speaker system shown in FIG. 1, taken along line 3—3, and showing the relationship of the internal cylindrical walls or partitions which define annular chambers.

As best shown in FIGS. 2, 3 and 4, the embodiment 10 is provided with partitions 32 mounted on the front panel 16 which are radially spaced from each other as shown to form corresponding annular chambers 34. The innermost partition defines the initial chamber 36 for the backwave and encloses the rear of the loudspeaker 12 which is mounted on the front panel 16. Similarly, partitions or walls 38 are mounted on the rear panel 18, the partitions 32 and 38 generally having similar cross-sectional configurations. However, the sizes or dimensions of the partition walls 32 and 38 are so selected, as best shown in FIGS. 3 and 4, so that these walls or partitions may be concentrically interweaved with each other. Stated otherwise, the partition walls 38 are received within the annular spaces 34 while the partition walls 32 are received within the annular spaces 40. When so interweaved, all the walls or partitions 32 and 38 together define intermediate chambers 42*a*–42*f* which are the actual chambers through which the backwave propagates. With this construction, the innermost chamber 36 is denominated as the initial chamber into which the back of the loudspeaker 12 initially introduces the backwave, the annular chambers 42*a*–42*e* are denominated as the intermediate chambers which define the tortuous path taken by the backwave, and the annular chamber 42*f* is denominated as the final chamber into which the backwave is transmitted just prior to being vented to the atmosphere through the vent opening 30.

Referring to FIG. 4, the loudspeaker 12 is shown mounted on the front panel 16 with the axis of the loudspeaker 12 being generally coincident with the axis 31 of the enclosure. The arrow designated by the reference numeral 44 represents the frontwave generated by the loudspeaker, while the reference numeral 46 designates the initial path taken by the backwave generated by the loudspeaker. As should be evident, the backwave 46 is initially propagated into the initial chamber 36.

As is best shown in FIG. 4, the axial length of the walls 32*a*–32*c* and the axial length of the walls 36*a*–36*c* are selected to be less than the spacing between the front panel 16 and the rear panel 18. The walls 32*c*, 32*b* and 32*a* constitute a first set of walls and are increasingly spaced from the axis of symmetry 31. The walls 32*c*, 32*b* and 32*a* are additionally shown to be decreasingly spaced from the rear panel 18. Similarly, the walls 36*c*, 36*b* and 36*a* form a second set of walls which are increasingly spaced from the axis of symmetry 31 and decreasingly spaced from the front panel 16. As will also be noted in FIG. 4, adjacent walls or partitions of the first and second sets 32*a*–32*c* and 36*a*–36*c* respectively, which are increasingly spaced from the axis of symmetry 31 are decreasingly spaced from each other. The annular spaces 42*a*–42*f* between adjacent cylindrical walls and the spacing between the walls and the front and rear panels are selected to maintain the effective area for the backwave as it propagates between the initial chamber 36 and the final chamber 42*f* approximately equal to the effective cone area of the loudspeaker 12. Thus, for example, as would be evident from FIGS. 2–4, 6 and 7, the peripheral length or circumference of the path for the back wave increases in a radial direction away from the axis of symmetry 44 and, therefore, the width can accordingly be decreased (not shown to scale in Figures).

Still referring to FIG. 4, there is shown in dashed outline the tortuous path 50 taken by the backwave 46 as it propagates between the initial chamber 36 and the output port or vent 30. The backwave is vented to the atmosphere omni-directionally and is represented by the reference numeral 52. As should be evident, with the embodiment shown in FIGS. 1–4, the backwave 46 travels in a predetermined direction which is generally normal to the axis 31 since it originates at the axis 31 and is vented to the atmosphere in a radial direction at 52. However, as described above, the backwave 46 does travel along directions parallel to the axis 31 while still inside the enclosure or housing 14.

The backwave 46 is caused to change its direction of propagation each time that it leaves one chamber and enters another successive chamber. Thus, the backwave 46 is deflected by at least 90° and advantageously 180° as it travels between adjacent chambers or compartments formed by the partition walls. With respect to the embodiment 10 shown in FIGS. 1–4, the backwave 46 changes directions or is deflected 180° as it travels from the initial chamber 36 to the first intermediate chamber 42*a*. Similarly, the backwave is deflected 180° as it travels from the first intermediate chamber 42*a* to the second intermediate chamber 42*b*, and so on. Upon emerging from the output vent 30, the backwave changes direction by 90° as it travels from the final intermediate chamber 42*f* to the atmosphere.

The construction described hereinabove with respect to the embodiment 10 shown in FIGS. 1–4 increases the internal surface area as seen by the backwave 46 and this serves to increase the air friction to the backwave to thereby increase the effective length of the tortuous path 50 as the backwave travels from the initial chamber 36 to the outlet vent 30. The partitions 32*a*–32*c* and 36*a*–36*c*, with the axial lengths thereof as shown, not only increases or optimizes the surface area seen by the backwave, but also substantially increases the number of bends which the backwave 46 experiences as compared to conventional labyrinth speakers. The substantial increase in the number of bends additionally has the effect of increasing the effective overall length for the backwave. Optimization of the effective length of path for the backwave permits the enclosure 14 to be minimized in terms of volume for a given free resonance of the speaker. On the other hand, optimization of the effective length of the backwave, for a given volume enclosure, permits the use of a speaker having a lower free air resonance.

Figures 9, 10, 11, 12, 13, 14, 15, 16, 17, 18:
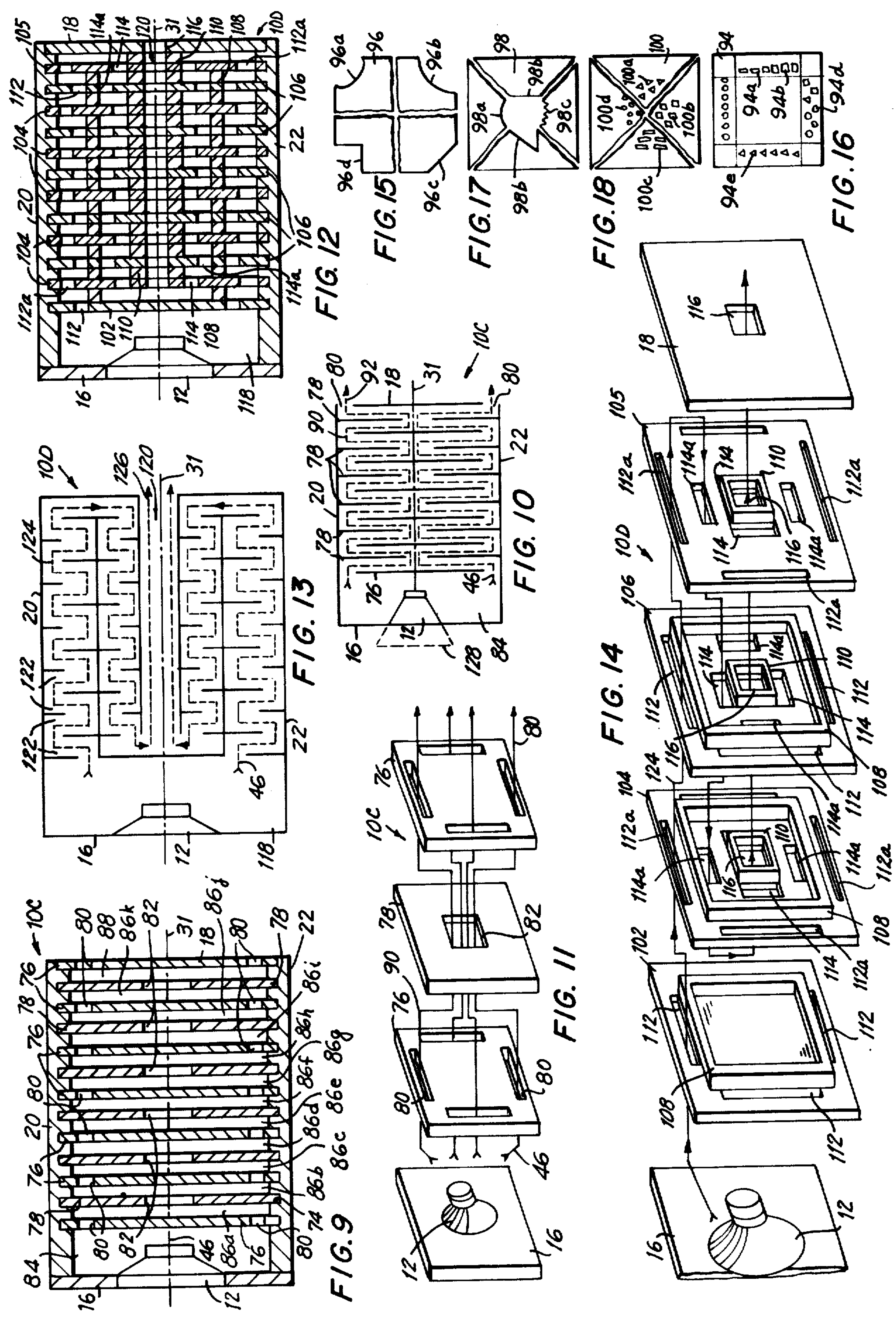
FIG. 9 is an enlarged cross-sectional view of a further embodiment of the present invention, taken along line 9—9 in FIG. 8, and showing a speaker enclosure having substantially planar partitions provided with aperture means so selected and arranged to form the tortuous path for the backwave.
FIG. 10 is a simplified view of the embodiment shown in FIG. 9, showing the tortuous path taken by the backwave, and showing an optional horn attached to the speaker enclosure for loading the front wave.
FIG. 11 is an exploded view in perspective of a portion of the speaker enclosure shown in FIG. 9, showing generally the path taken by the backwave as it propagates through the various apertures in the planar partitions.
FIG. 12 is yet a further embodiment of the present invention, shown in cross-section, and also including generally planar partitions similar to the embodiment shown in FIG. 9, this embodiment including additional apertures and spacer members to define an extended tortuous path.
FIG. 13 is similar to FIG. 10 and shows, in simplified form, the partitions and apertures of the embodiment of FIG. 12, showing the turtuous path travelled by the backwave.
FIG. 14 is similar to FIG. 11, and shows an exploded view in perspective of a portion of the speaker enclosure shown in FIGS. 12 and 13, and also shows one of the typical paths taken by a portion of the backwave as it propagates through the various partitions and aperture means.
FIGS. 15 and 16 are side elevational views of generally planar partitions which may be used in the embodiment shown in FIG. 9, showing variations of peripheral aperture means which may be used in place of the peripheral slots shown in FIGS. 9–11.
FIGS. 17 and 18 are similar to FIGS. 15 and 16, except that these show variations of central aperture means which may be utilized in place of the generally rectangular opening shown in FIGS. 9–11.

While not shown, the effective length of the speaker system as shown in FIG. 10 may be further increased by the use of acoustical means for lining the interiors of at least some of the chambers. Alternately, suitable acoustical means may be used for stuffing or filling at least some of the chambers. Both of these approaches increase the effective length of the path of the backwave, as conventionally known. However, with the novel construction described above, the enclosure 10 can usually be used without acoustical stuffing materials while still providing sufficiently long effective lengths. Since acoustical stuffing materials used in loudspeaker enclosures for stuffing the same normally make loudspeaker systems less efficient and overdamped, the present construction provides substantially better audio characteristics.

Figure 5:
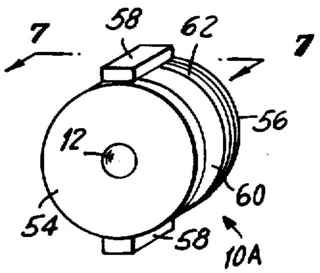
FIG. 5 is another embodiment of the labyrinth speaker system in accordance with the present invention and is generally similar to the embodiment shown in FIG. 1 except that it has a generally circular cylindrical configuration or shape.
Figure 8:
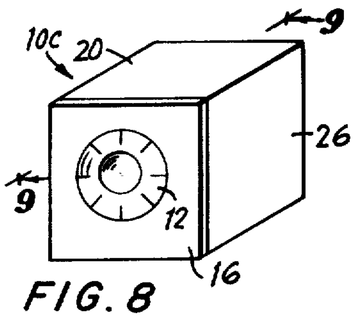
FIG. 8 is a perspective view of an enclosure applicable for the embodiments shown in FIGS. 9-14.
Figure 6:
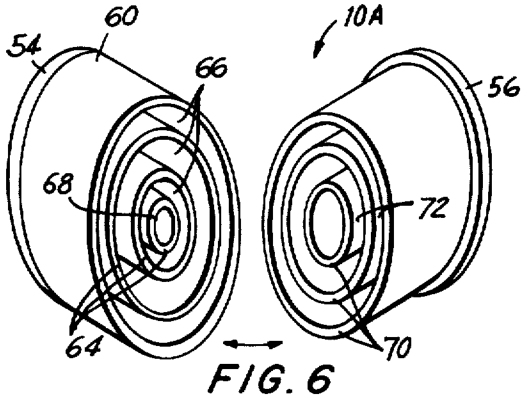
FIG. 6 is similar to FIG. 2, but showing the two sections of the embodiment shown in FIG. 5 separated from each other.
Figure 7:
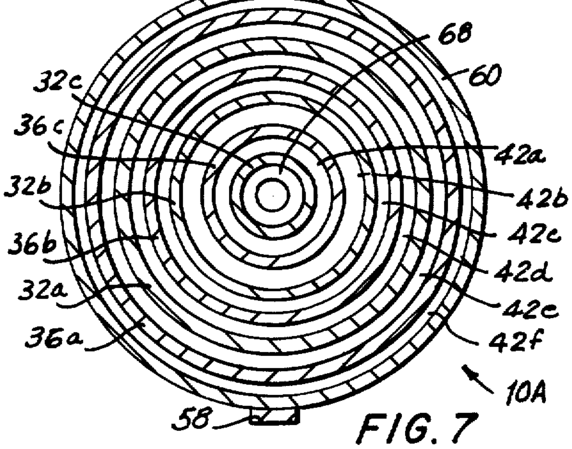
FIG. 7 is an enlarged cross-sectional view similar to FIG. 3, but showing the embodiment shown in FIG. 5, taken along line 7—7.

Referring now to FIGS. 5, 6 and 7, a second embodiment 10A is shown which is substantially similar in construction to the first described embodiment 10. However, in the first embodiment 10, the cylindrical walls have rectangular cross-sections taken in the plane normal to the axis of symmetry 31. On the other hand, in the embodiment 10A, the cylindrical walls have circular cross sections taken in a plane normal to the axis of symmetry. More specifically, it will be noted that the embodiment 10A has a front panel 54 and a rear panel 56 each of which are circular in configuration. A circular cylindrical outer wall 60 encloses the sides of the enclosure and is mounted on the front panel 54. As with the embodiment 10, bracing members 58 are rigidly connected to the front and rear panels 54, 56 respectively, and maintain the front and rear panels spaced from each other a predetermined distance. Also as with the embodiment 10, the axial length of the outer wall 60 is less than the spacing between the front and rear panels 54, 56 to provide a substantially circular or annular output vent 62 proximate to the outer periphery or edge of the rear panel 56.

Referring to FIGS. 6 and 7, the second embodiment 10A is also shown to consist of two separate sections which are coaxially interweaved when the two sections are assembled.

The first section of the embodiment 10A, which includes the front panel 54, includes a plurality of coaxial cylindrical walls or partitions 64. The partitions or walls 64 have different diameters so as to form annular spaces 66 therebetween. Similarly, the section of the embodiment 10A, which includes the rear panel 56 includes a plurality of spaced walls or partitions 70 which are also of different diameters to form annular spaces 72. The diameters of the walls 64 and of the walls 70 are so selected so that the walls 64 can be received within the spaces 72 while the walls 70 are received within the annular spaces 66 to form annular circular intermediate chambers 42*a*–42*e* which together form the tortuous path for the backwave. The innermost cylindrical partition 64 defines an initial chamber 68 which encloses the rear of a loudspeaker 12 mounted on the front panel 54. The outermost annular chamber or compartment 42*f* defines the output or final chamber from which the backwave is vented to the atmosphere through the output vent 62.

While FIG. 4 has been described as a cross section of the first described embodiment 10, this Figure is also applicable to the second embodiment 10A. The internal construction of the cylindrical partition, apertures and relative spacings within the enclosure are substantially similar for both embodiments. In each case, the tortuous path 50 would be similar as shown.

While the axial length and spacings between the partitions described in connection with the embodiments 10 and 10A are advantageously selected to present a substantially uniform cross-sectional area to the backwave which is approximately equal to the effective cone area of the loudspeaker 12, the effective cross-sectional area for the backwave may, in some instances, be made equal to less than the effective cone area. Such a modification in the construction or design of the enclosure produces different degrees of advantage and, may be desirable under certain circumstances.

With respect to the embodiments 10 and 10A, the partitions have been shown to be mounted on the front and rear panel of the respective enclosures. These partitions may be connected to their associated panels in any conventional manner. However, in order to improve the rigidity of the overall structure, it has been found advantageous to provide grooves on the inside surfaces of the front and rear panels which are configurated and dimensioned to receive the end edges of the cylindrical partitions. The partitions are maintained within the grooves by use of any suitable adhesive or fastening means, such as screws, and preferably both an adhesive and fastening means are used. The use of grooves as suggested will be further described in connection with FIGS. 9 and 12.

With respect to the embodiment 10A, which is circular in configuration, thin, stiff paper or cardboard cylinders could be used as the partitions 32*a*–32*c* and 36*a*–36*c*. Such use of stiff paper or cardboard for the partitions, in place of wood or other heavier materials, would result in a reduction of weight and cost. Additionally, the use of a circular front panel would provide improved performance since it would result in less wave distortion than if a square or rectangular front panel was used, due to the fact that sound waves are hemispherical in nature and generally exhibit circular symmetry. Additionally, with respect to circular cylindrical partitions, these could be mounted or assembled with greater facility since a plurality of ring-type vertical circular saw blades mounted on a common shaft could be used to cut out the speaker mounting hole and make the circular grooves in the front panel for mounting the partitions, all this being done in one operation. The same operation could be used to form the rear panel and the grooves for accepting the circular cylinders or partitions which are mounted thereon.

The embodiments 10 and 10A are exemplary of embodiments wherein the predetermined direction of propagation of the backwave is substantially normally to the axis of symmetry. The embodiments which will now be described are designed to cause the backwave to propagate in a predetermined direction substantially parallel to the axis of symmetry of the enclosure.

As should be evident from the above description, both the embodiments 10 and 10A cause the backwave, after leaving the initial chamber, to assume a cross-sectional configuration which is generally angular in shape. With respect to the embodiments now to be described apertures or openings are provided on generally planar partitions, the apertures being spaced from the axis of symmetry and from each other proximate to the periphery of these partitions to cause the backwave to assume a cross-sectional configuration which is generally in the shape of a segmented annulus when the backwave propagates through the openings or apertures.

More specifically, the second type of enclosures in accordance with the present invention include partitions which are planar and substantially rectangular in shape. In the presently preferred embodiments, these partitions are square in shape. The partitions are spaced from each other along the axis of symmetry of the enclosure, with alternate ones of these partitions being provided with apertures in the nature of peripheral openings. Intermediate partitions are disposed between the alternate partitions and are provided with apertures in the nature of central openings. In this manner, the backwave propagates in directions substantially normal to the axis of symmetry subsequent to passage to each aperture or opening in any one of the partitions.

Referring to FIGS. 8 through 11, an enclosure 10C is shown which has a speaker 12 mounted on a front panel 16, as with the other described embodiments. However, here the top panel 20, the bottom panel 22 and the side panels 26 have a depth equal to the spacing between the front panel 16 and the rear panel 18.

As described above, the internal surfaces of the enclosure panels are provided with grooves 74 which are dimensioned to securely receive the edges of the partitions.

The internal partitions or walls can generally be classified as being either odd partitions 76 or even partitions 78. The odd partitions 76 are provided with peripheral slots 80 which are generally elongate and extend substantially about the entire periphery of each of the odd partitions 76. On the other hand, the even partitions are shown to be provided with a central opening 82 which is generally rectangular in configuration and is disposed coaxially with the axis of symmetry 31 of the enclosure.

The first odd partition 76 forms, together with the front panel 16 and the peripheral panels, an initial chamber 84 into which the rear of the loudspeaker 82 initially propagates the backwave. Subsequently, each pair of adjacent partitions 76 and 78 produce an intermediate chamber. In FIG. 9, the intermediate chambers are identified by the reference numerals 86*a* through 86*k*. The last partition, which is an even partition 78, forms, together with the rear panel 18 and the other peripheral panels of the enclosure, a final chamber 88. The rear panel 18 is similar in cónstruction to an odd panel 76 in that it is also provided with peripheral slots 80 which, in this embodiment, define the output ports or vents through which the backwave is discharged into the atmosphere.

As will be evident particularly from an examination of FIGS. 10 and 11, the partitions 76 and 78, and apertures 80 and 82 are arranged to successively break up the backwave into a substantially annular shape, such as at 90, and subsequently substantially reconstitute the backwave upon passage through the central openings 82 in the even partitions 78.

While in the embodiment shown in FIG. 9, the peripheral aperture means are in the nature of peripheral slots 80, and the central aperture means are in the nature of central openings 82, it is possible to achieve the same effect by using a multitude of other types of aperture means. For example, referring to FIGS. 15 and 16, there is shown other examples of types of peripheral aperture means which may be used, while different forms of central aperture means are shown in FIGS. 17 and 18. In FIG. 15, the partition 96, which is an equivalent of the odd partitions 76 in FIG. 9, are shown to have corner portions, the peripheral aperture means in this partition being in the nature of corner portions which have been cut away. The configurations of the cuts are not critical and the following cut lines are exemplary: eliptical cuts 96a, circular cuts 96b, triangular cuts 96c and square cuts 96d. In FIG. 16, still other possible forms of peripheral aperture means are shown. Thus, the partition 94, again an equivalent of an odd partition 76 in FIG. 9, the aperture means are in the nature of a series or plurality of smaller holes arranged in series as shown. The smaller holes can also take on different configurations, and these are illustrated, by way of example only, by the following hole configurations: rectangular holes 94a, square holes 94b, circular holes 94d and triangular holes 94e. Of course, as will be evident, any combination of these holes can be used with substantially the same or similar effect.

Similarly, as suggested above, the central opening 82 and the even partitions 78 can be replaced by a multitude of other equivalent central type openings. Referring to FIGS. 17 and 18, some examples of such openings are shown by way of illustration only. In FIG. 17, it is suggested that the central opening can have different configurations other than the square configuration 82 shown in FIG. 11. Thus, the central opening can have different shapes including: a circular opening 98a, rectangular opening 98b, irregular opening 98c and triangular or other polygonal shape 98d. In FIG. 18, the central opening is formed by a plurality of holes which are provided in and about the axis of symmetry of the enclosure. Again, these plurality of openings can have different shapes and may be used in any conbination. On the illustrative panel 100, the central openings are shown to be triangular openings 100a, square openings 100b, rectangular openings 100c or circular openings 100d. With respect to all of the aforementioned openings, whether peripheral or central, it is only important that the overall effective area presented to the backwave as the backwave passes through a particular partition is equal to approximately the effective cone area of the loudspeaker 12. Aside from this basic requirement, the specific opening used is not critical and any combination of such openings may be used.

In FIG. 10, which is a simplified schematic view of the embodiments shown in FIGS. 9 and 11, the backwave 46 is shown as it moves along the tortuous path 90 defined by the internal partitions. Also, the backwave is shown to be vented to the atmosphere through the output ports 80, the outgoing backwave being designated by the reference numeral 92. It will be seen that while the backwave general propagates in a direction parallel to the axis 31, it is deflected by the partitions and caused to travel over a substantial portion of its tortuous path in directions substantially normal to the axis of symmetry 31. It is by virtue of this type of tortuous path that the effective length to the backwave is substantially increased.

Still referring to FIG. 10, there is shown a horn 128 which is mounted on the front panel 16 and is positioned with respect to the loudspeaker 12 to load the front wave generated by the speaker. Such a horn may be an exponential horn, a hyperbolic horn or a conical horn. Such horns are generally known, and may be used in conjunction with any one of the embodiments in the present invention, to provide better coupling of the front wave to the atmosphere and, consequently increase the overall efficiency of the speaker system.

Referring now to FIGS. 12-14, there is shown a still further embodiment 10D which in many respects is similar to the embodiment 10C above-described. Referring to FIG. 12, the second, fourth, sixth, eighth and tenth partitions following the initial partition 102 are designated by the reference numeral 104, while the third, fifth, seventh and the ninth partitions are designated by the reference numeral 106. A final partition, which is the eleventh partition is designated by the reference numeral 105 and it is followed by the rear panel 18.

In this embodiment shown in FIG. 12, all the partitions subsequent or following the partition 102 are provided with coaxially aligned central openings 116. Also, all the partitions other than the rear panel 18 are provided with substantially aligned peripheral openings 112, 112a. All the partitions other than the first partition 102 and the rear panel 18 are provided with substantially aligned intermediate openings 114, 114a generally disposed between the peripheral and central openings. Thus, the initial partition 102 is only provided with outer peripheral slots 112. The rear panel is only provided with a central opening 116. However, the panels 104 and 106 are each provided with peripheral openings 112, 112a, intermediate openings 114, 114a and central openings 116.

There is also provided in the embodiment 10D spacer means 108 and 110 between adjacent partitions which separates the central, intermediate and peripheral openings to form a coaxial final chamber 120 through the central openings 116. A tortuous annular path 124 is formed which is folded once upon itself and extends through the peripheral and intermediate openings. The tortuous path extends between the initial chamber 118 and the final chamber 120.

As will best be noted from FIG. 14, the outer peripheral slots formed in the partitions 102, 104, 106 and 105 are situated in one of two radially spaced positions. The peripheral openings 112 which are provided on the partitions 102 and 106 are situated at the more proximate radial positions, while the peripheral slots 112a provided on the partitions 104 and 105 are situated at the more remote radial positions. In this manner, the backwave is caused to follow a tortuous path as it passes through the outer peripheral openings, as suggested in FIGS. 13 and 14.

Still referring to FIG. 14, the intermediate openings 114 and 114a are similarly situated in one of two radially spaced positions. Each of the partitions 104, 105 and 106 are provided with two inwardly spaced intermediate openings 114 and two outwardly spaced intermediate openings 114a. On the partitions 104 and 105, the intermediate openings 114 are horizontally aligned, while the intermediate openings 114a are vertically aligned. On the other hand, on the partitions 106, the intermediate openings 114 are vertically aligned while the intermediate openings 114a are horizontally aligned. The intermediate openings 114 and 114a are aligned on adjacent partitions as shown in FIG. 14 to cause the backwave to follow a tortuous path as it passes through the intermediate openings as suggested in FIGS. 13 and 14.

The above referred to spacer means 108 and 110 generally comprise spacer members which extend between each pair of adjacent partitions, each spacer being in the nature of a cylindrical or annular member as shown.

Referring to FIG. 13, this is a simplified schematic view of the embodiment 10D shown in FIGS. 12 and 14 and illustrates the manner in which the backwave initially propagates into the initial chamber 118 first traverses the tortuous path caused by the nonalignment or successive radial displacement of the peripheral apertures 112, 112*a*. Propagation through the peripheral slots corresponds to the propagation of the backwave through the first leg or portion of the tortuous path 124. When the backwave reaches the back panel 18, it is reflected therefrom and caused to propagate through the intermediate openings 114, 114*a*, this corresponding to propagation of the backwave through the second leg or portion of the tortuous path 124. When the backwave 46 reaches the end of the tortuous path, it is reflected from the solid central portion of the initial partition 102 and is there reflected into the final chamber 120, from which the backwave is vented to the atmosphere at 126.

It can be seen that partitions 104,105, and 106, of FIG. 14 are shown having intermediate chambers that have both peripheral and central openings in the same partition. This is shown by way of illustration only to explain two features of the invention.

1. The first in a series of intermediate chambers may have either central or peripheral openings without departing from the teachings of the invention.

If a particular partition is used to form more than one intermediate chamber, it does not have to provide the same type openings for each chamber.

Referring to FIG. 14. The path of a speaker backwave will be explained, showing the different paths that are taken when either slots 114 or 114*a* are used. The path when slots 114 are used, is shown by line 124, beginning at the speaker 12, through slot 112 of partition 102, through slot 112*a* of partition 104, through slot 112 of partition 106, through slot 112*a* of partition 105, changing direction 180°, through slot 114*a* of partition 105, through slot 114 of partition 106, through slot 114*a* of partition 104, through final chamber 116, after changing direction 180° for the second time, of partitions 104,106,105, and 18.

When slots 114*a* are used, the path is identical except that after the path is changed 180° for the first time, after going through slot 112*a* of partition 105, the path is through slots 114,114*a*, and 114 of partions 105,106, and 104 respectively. In other words, both paths are identical except that slots 114 and 114*a* of partitions 104,106, and 105 are interchanged.

While the intermediate chambers in the embodiment 10C are formed by each two adjacent partitions, and said intermediate chambers have cross-sectional areas substantially corresponding to the cross-sectional area of the enclosure, the intermediate chambers in the embodiment 10D are substantially smaller in cross-sectional area. In the embodiment 10D, the intermediate chambers are similarly formed by adjacent internal partition, but are also limited in size by the inner and outer spacer members 108 and 110. This construction substantially increases the number of bends to which the backwave 46 is exposed, this increasing the effective length for the backwave path.

It is to be understood that the foregoing description of the various embodiments illustrated herein is only exemplary of the present invention and various modifications to these embodiments shown may be made without departing from the spirit and scope of the invention.

What is claimed is:

1. A labyrinth speaker system which substantially maintains the free air resonance frequency of a speaker mounted therein and having a generally large total internal surface area as compared to its volume, comprising a cabinet enclosure having front, side and rear panels; partition means inside said enclosure for forming an initial chamber, a plurality of intermediate chambers, and a final chamber, said initial chamber bounding on said front panel and said final chamber bounding on at least one of said panels and having an output port opening to the outside of said enclosure; speaker means having an effective cone area for generating a backwave to be initially propagated into said initial chamber and a front wave, said partition means including a plurality of generally parallel partitions being spaced from each other along a predetermined direction and defining an axis of symmetry and defining adjacent intermediate chambers, said partitions being provided with aperture means communicating the interiors of respective adjacent intermediate chambers, alternate said partitions being provided with center aperture means generally located about said axis of symmetry; remaining alternate partitions having non-aligned peripheral aperture means generally located about said axis of symmetry and at different radial distances to form folds in the speaker back wave path; said peripheral aperture means having a predetermined total cross sectional area and consisting of four generally equal peripheral openings, each comprising a series of smaller openings; said center aperture means having a predetermined total cross sectional area and consisting of four generally equal center openings, each comprising a series of smaller openings; said partitions, said center aperture means, and said peripheral aperture means forming a tortuous path which causes said back wave to change directions of propogation at least 90° upon entry into each successive intermediate chamber, and the cross sectional area presented to said back wave in said tortuous path being essentially constant.

2. A labyrinth speaker system as defined in claim 1, wherein said speaker means is mounted on said front panel.

3. A labyrinth speaker system as defined in claim 1, wherein said aperture means comprises a plurality of slots spaced away from said axis of symmetry and spaced from each other proximate to the periphery of at least one of said partitions, whereby said back wave assumes a cross-sectional configuration which is generally in the shape of a segmented annulus when said back wave propagates through said slots.

4. A labyrinth speaker system as defined in claim 1, wherein said predetermined direction is substantially parallel to said axis of symmetry.

5. A labyrinth speaker system as defined in claim 1, wherein said tortuous path, aperture means and said output port all have effective cross-sectional areas for said back wave less than said effective cone area.

6. A labyrinth speaker system as defined in claim 1, further comprising a horn connected to said front panel to enclose the periphery of said speaker means to load the front wave of said speaker means.

7. A labyrinth speaker system as defined in claim 1, wherein a continuous path having a substantially uniform cross-sectional area equal to approximately said effective cone area extends at least a portion of the length travelled by said back wave.

* * * * *